United States Patent [19]
Kawai

[11] Patent Number: 6,111,273
[45] Date of Patent: Aug. 29, 2000

[54] SEMICONDUCTOR DEVICE AND ITS MANUFACTURING METHOD

[75] Inventor: Hiroji Kawai, Kanagawa, Japan

[73] Assignee: Sony Corporation, Tokyo, Japan

[21] Appl. No.: 09/233,909

[22] Filed: Jan. 21, 1999

[30] Foreign Application Priority Data

Jan. 28, 1998 [JP] Japan .................................. 10-015446

[51] Int. Cl.$^7$ .................................................. H01L 33/00
[52] U.S. Cl. .............................. 257/94; 257/506; 257/102
[58] Field of Search ............................... 257/99, 94, 102, 257/506

[56] References Cited

U.S. PATENT DOCUMENTS 5,929,467  7/1999  Kawai et al. ............................ 257/192

FOREIGN PATENT DOCUMENTS 411233822A  8/1999  Japan .

*Primary Examiner*—Donald L. Monin, Jr.
*Assistant Examiner*—Douglas A. Wille
*Attorney, Agent, or Firm*—Hill & Simpson

[57] ABSTRACT

It is intended to provide a semiconductor device and its manufacturing method in which a high-resistance region maintaining a high resistance even under high temperatures can be made in a nitride III–V compound semiconductor layer having an electric conductivity by ion implantation. After a nitride III–V compound semiconductor layer having an electric conductivity is grown, a high resistance region is formed in the nitride III–V compound semiconductor layer by locally implanting boron ions therein. The amount of implanted boron is preferably not less than $\frac{1}{30}$, or more preferably not less than $\frac{1}{15}$, of the carrier concentration of the nitride III–V compound semiconductor layer. The high-resistance region is used as a device isolating region of an electron moving device or as a current blocking layer of a semiconductor laser.

4 Claims, 9 Drawing Sheets

SEMICONDUCTOR DEVICE AND ITS MANUFACTURING METHOD

RELATED APPLICATION DATA

The present application claims priority to Japanese Application No. P10 015446 filed Jan. 28, 1998 which application is incorporated herein by reference to the extent permitted by law.

BACKGROUND OF THE INVENTION

1. Field of the Invention

This invention relates to a semiconductor device and its manufacturing method especially suitable for use to various kinds of semiconductor devices using nitride III–V compound semiconductors.

2. Description of the Related Art

GaN semiconductors are direct-transitional semiconductors. Their bandgaps range from 1.9 eV to 6.2 eV, and they enable realization of light emitting devices capable of emitting light over visible regions to ultraviolet regions. For these reasons, they are attracting attention and are placed under vigorous developments. Further, these GaN semiconductors have a great possibility as materials of electron transport devices. That is, the saturation electron velocity of GaN is as large as approximately $2.5 \times 10^7$ cm/s as compared with Si, GaAs and SiC, and its breakdown electric field is as large as approximately $5 \times 10^6$ V/cm next to diamond. For these reasons, GaN semiconductors have been expected to have a large possibility as materials of electron transport devices for high frequencies, high temperatures and high powers.

As widely known, semiconductor devices are generally required to have a high resistance in regions other than device regions. For example, in a semiconductor laser having a stripe-shaped current path to concentrate a current and induce laser oscillation, currently used for making the current blocking structure are a method of growing semiconductor layers forming the laser structure, then making an insulation film on the surface thereof, and making a stripe-shaped window in the insulation film to use it as the current path, or a method of increasing the resistance of semiconductor layers other than the stripe portion by ion implantation. On the other hand, in electron moving devices, currently used are a method of fully removing conductive layers other than the device region by mesa etching or a method of locally increasing the resistance of the conductive layers by ion implantation. However, for semiconductor devices using GaN semiconductors, no optimum method has been established for increasing the resistance of regions other than device regions. Therefore, to date, devices using GaN semiconductors cannot perform their true characteristics.

Among the above-mentioned methods, the method of locally increasing the resistance of conductive layers by ion implantation is advantageous for making an IC because the high resistance region can be made in substantially the same plane as the device region. Actually, in most cases, isolation of devices in GaAs-based IC devices relies on this method for making a high resistance region by ion implantation. In Si-based devices, however, since the bandgap of Si is as small as 1.1 eV and acceptable insulation cannot be made by ion implantation, isolation of devices relies on pn junction.

As to semiconductor devices using GaN semiconductors, light emitting diodes have been brought into practical use, but semiconductor lasers or electron transport devices have not been realized yet for practical use. For semiconductor lasers and electron transport devices currently under developments, mesa etching is used for the former, and ion implantation for making a high resistance region or mesa etching is used for the latter. Among them, as to ion implantation for making a high resistance region, proposals given heretofore are briefly explained below.

Probably, the first report on ion implantation to GaN was Appl. Phys. Lett., 42, 430(1983), which used beryllium (Be) or nitrogen (N) as ion species. The true object of ion implantation in this report was to decrease the carrier concentration and increase the Schottky barrier height and not to isolate devices. Next reported in Appl. Phys. Lett., 63, 1143(1993) was an example using fluorine (F) as ion species of ion implantation for isolation of devices. Thereafter, also reported were examples using N and O as ion species for the same purpose (Appl. Phys. Lett., 66, 3042(1995) and J. Electron. Mater., 25, 839(1996)). These reports indicated that a difference appeared in resistance value among ion species O, N and F as a result of annealing and that a chemical difference appeared among defective species. Further reported were hydrogen (H) and helium (He) as ion species of ion implantation for isolation of devices (IEEE IEDM proceedings 96, 27(1996)).

As reviewed above, there have been proposed H, N, O, F and Be as ion species of ion implantation for making a high resistance region or for isolation of devices in semiconductor devices using GaN semiconductors. Among these ion species, complex defect of O is believed to make deepest levels and to be therefore optimum. From a chemical viewpoint, O is considered best, but there is no data on devises using it, and it is not yet a reliable technology. Although only H is used currently, H is liable to move when annealed, then diffuses into the device region, combines with donors or acceptors and inactivate them, decreases the carrier concentration, and invites deterioration of the device, for example. Therefore, H cannot be a good ion species. It was also reported that H as the ion species for making a high resistance region defects were annealed out due to a high temperature and recovered a conductivity (J. Appl. Phys., 78(5), 3008(1995)). Also, N, F and Be are not good ion species.

OBJECTS AND SUMMARY OF THE INVENTION

It is therefore an object of the invention to provide a semiconductor device and its manufacturing method capable of forming a high-resistance region maintaining a high resistance even under high temperatures in an electrically conductive nitride III–V compound semiconductor layer by ion implantation.

To solve the problems involved in the conventional technologies, the Inventor made researches, and found that boron (B) is best as ion species for ion implantation for making a high resistance region in a semiconductor device using GaN semiconductors. B is one of group III elements in the group common to gallium (Ga) and aluminum (Al). Unexpectedly, B is used as the ion species for ion implantation for making high resistance regions in AlGaAs semiconductor lasers or GaAs FETs; however, it has been unknown to use B as the ion species in semiconductor devices using GaN semiconductors.

The Inventor evaluated high resistance regions made by ion implantation of B into GaN semiconductors. Samples for evaluation were prepared in the following process. That is, after a GaN buffer layer was grown on a c-face sapphire substrate by metal organic chemical vapor deposition (MOCVD) at a low growth temperature around 560° C., sequentially grown on the GaN buffer layer by MOCVD were a 2 μm thick undoped GaN layer, a 0.2 μm thick n-type GaN layer doped with Si by $3\times10^{19}$ cm$^{-3}$, and a 4 nm thick AlN layer. Thereafter, the c-face sapphire substrate having these layers grown thereon was cleaved into two, and one of which was used as sample (1) and the other as sample (2). B was ion-implanted into sample (1) under the conditions of the implantation energy being 60 keV and the dose amount being $1\times10^{14}$ cm$^{-2}$ whereas B was ion-implanted into sample (2) under the conditions of the implantation energy being 60 keV and the dose amount being $2\times10^{3}$ cm$^{-2}$. After that, distribution profiles of B, Si and Ga in the depth direction in samples (1) and (2) were measured by secondary ion mass spectrometry (SIMS). The results are shown in FIGS. 1 and 2. FIG. 1 is on sample (1), and FIG. 2 is on sample (2).

As shown in FIGS. 1 and 2, the peak depth of B concentration under the implantation energy of 60 keV was about 0.15 to 0.16 μm which as deeper than the calculated expected value 0.12 μm. In FIGS. 1 and 2, distribution of Si near the surfaces is the intrinsic phenomenon caused by measurement.

The samples (1) and (2) were divided into 5 mm square ones, and they were annealed for thirty minutes in a $N_2$ atmosphere at 300° C., 400° C., 500° C., 600° C., 700° C., 800° C. and 900° C., respectively. After that, Au/In electrodes were made at four corners of each sample, and their resistance values were measured by the four-point probe technique. Explained below are results of measurement of resistance values. The sheet resistance value of samples without ion implantation of B was approximately 100 Ω/□.

FIG. 3 shows dependence of the sheet resistance value of sample (1) with the dose amount of B being $1\times10^{14}$ cm$^{-2}$ upon the annealing temperature. The value before annealing is the sheet resistance value of the measurable limit (100 G Ω/□. As shown in FIG. 3, although the sheet resistance value gradually decreases as the annealing temperature becomes high, high sheet resistance values around 1 MΩ/□ are obtained even under 500° C., although variant more or less, and remarkably high sheet resistance values around 10 MΩ/□ are obtained under 400° C. Since the sheet resistance of 1 MΩ/□ is practically sufficiently high as the high resistance region for isolation of devices or for blocking the current, if the dose amount of B is $1\times10^{14}$ cm$^{-2}$ in samples having the initial sheet resistance of 100 Ω/□ before ion implantation, then high resistance regions maintaining high sheet resistance values not lower than 1 MΩ/□ even under 500° C. will be obtained.

FIG. 4 shows dependence of the sheet resistance value of sample (2) with the dose amount of B being $2\times10^{13}$ cm$^{-2}$ upon the annealing temperature. The sheet resistance value before annealing of this sample (2) was 5 kΩ/□. As shown in FIG. 4, the sheet resistance value is approximately 10 kΩ/□ even under 200° C. which is insufficient as the sheet resistance value of the high resistance region for isolating devices or for blocking the current.

Next reviewed are SIMS profiles of sample (1) shown in FIG. 1. If the doping concentration of Si is $3\times10^{19}$ cm$^{-3}$ and the doped layer is 0.25 μm thick, then doped Si amounts to $3\times10^{19}\times2.5\times10^{-5}=7.5\times10^{14}$ cm$^{-2}$. Since the carrier concentration (concentration of electrons) obtained by Hall measurement apart from the measurement of sheet resistance values was $8\times10^{14}$ cm$^{-2}$, it is shown that the activation ratio of Si is approximately 1 (100%), taking it into account that the Si concentration of the Si-doped layer is $7.5\times10^{14}$ cm$^{-2}$ That is, it is known that one electron generates from one Si atom. As to the entirety of the B ion implanted layer, since the dose amount that can maintain high sheet resistance values around 1 MΩ/□ even under 500° C. is $1\times10^{14}$ cm$^{-2}$ as explained above, one B atom exists per 10 electrons in average immediately after the growth.

Reviewing it in greater detail, B atoms do not distribute evenly in the ion implanted layer as shown in FIG. 1. Since the resistance must be high even in portions of the B-ion implanted layer with the lowest concentration, if the resistance is still high in the depth of 0.25 μm where the concentration of B is approximately $2\times10^{18}$ cm$^{-3}$ as shown in FIG. 1, then one B atom results in existing per 15 electrons because, when the Si concentration is $3\times10^{19}$ cm$^{-3}$, the ratio of Si concentration ([Si]) relative to the B concentration ([B]) is [Si]/[B]=$3\times10^{19}/2\times10^{18}$ cm$^{-2}$=15 approximately.

Next reviewed is sample (2) whose dose amount of B is $2\times10^{13}$ cm$^{-2}$. The B dose amount of sample (2) is ⅕ of the B dose amount of sample (1). The sheet resistance value of sample (2), although not high sufficiently, varies from 100 Ω/□ before ion implantation to 5 kΩ/□ by ion implantation of B. It means that the resistance increases with a high efficiency relative to a unit amount of ion implantation of B before it reaches a high sheet resistance value, but the effect of increasing the resistance relative to the unit amount of ion implantation decreases with increase of the amount of ion implantation. Reviewing it from the opposite side, it means that, with amounts of ion implantation increasing the sheet resistance value up to a quasi-insulated state, changes in amount of ion implantation as large as ½ to two times thereof do not affect so much to the insulated state. Therefore, the above-indicated B concentration sufficient for insulation, [Si]/[B]=15, is not strictly required, but it is reasonable to allow room of ½ to two times thereof. Thus, it is sufficient for the B concentration to be approximately ¹⁄₃₀ relative to the electron concentration in the state immediately after the growth.

The discussion made above have been made as making high resistance regions in Si-doped n-type GaN layers. The same, however, also applies to general cases where high resistance regions are made in n-type GaN semiconductor layers doped with Si or any other donor, and also to cases where high resistance regions are made in p-type GaN semiconductor layers doped with magnesium (Mg) or any other acceptor.

The present invention has been made based on the above-explained researches by the Inventor.

To attain the object, according to the first aspect of the invention, there is provided a semiconductor device including a high-resistance region locally formed in an electrically conductive nitride III–V compound semiconductor layer, comprising:

the high-resistance region being made by ion implantation of boron.

According to the second aspect of the invention, there is provided a method for manufacturing a semiconductor device including a high-resistance region locally formed in an electrically conductive nitride III–V compound semiconductor layer, comprising:

the step of forming the high-resistance region by ion implantation of boron into a selective portion of the nitride III–V compound semiconductor layer.

In the invention, the sheet resistance of the high resistance region is preferably not lower than 1 MΩ/□ and more preferably not lower than 10 MΩ/□ in the range of working temperatures of the semiconductor device. The amount of implanted boron is preferably not less than 1/30 and more preferably not less than 1/15 of the carrier concentration of the nitride III–V compound semiconductor layer.

In the invention, the nitride III–V compound semiconductor layer is made of at least one kind of group III element selected from the group consisting of Ga, Al, In and B and at least N, and may additionally contain a group V element such as As or P where appropriate. Specific examples of the nitride III–V compound semiconductor layer are GaN layer, AlGaN layer, GaInN layer, AlGaInN layer, and so forth.

According to the invention having the above construction, when boron (B) is ion-implanted into the nitride III–V compound semiconductor layer, B enters into the nitride III–V compound semiconductor layer, impacts crystal lattices therein and makes defects. More specifically, when the nitride III–V compound semiconductor layer contains GaN, for example, as its major component, Ga—N bonds are cut by ion implantation of B, or Ga and N are compelled to move from their sites. These defects make deep levels in the forbidden band, and they become traps of carriers and decrease the carriers. As a result, resistance of the region implanted with B ions is increased. Further, these defects are stable even under high temperatures around 500° C., for example, and the trapping effect of carriers by deep levels of the defects is maintained stable.

Although the nitride III–V compound semiconductor layer implanted with B ions contains defects making shallow levels, these defects easily couple electrically with neighboring similar defects, and carriers trapped by the shallow levels made by these defects can move along the shallow levels. This is called hopping conduction, and it is said that annealing can remove these defects and increase insulation. However, it depends upon the ion species for ion implantation or the dose amount, and annealing may rather accelerate recovery of these defects and may decrease the resistance value.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Embodiments of the invention are explained below with reference to the drawings.

First explained is a method for manufacturing a GaN FET according to the first embodiment of the invention. FIG. 5 shows the manufacturing method.

Figure 1:
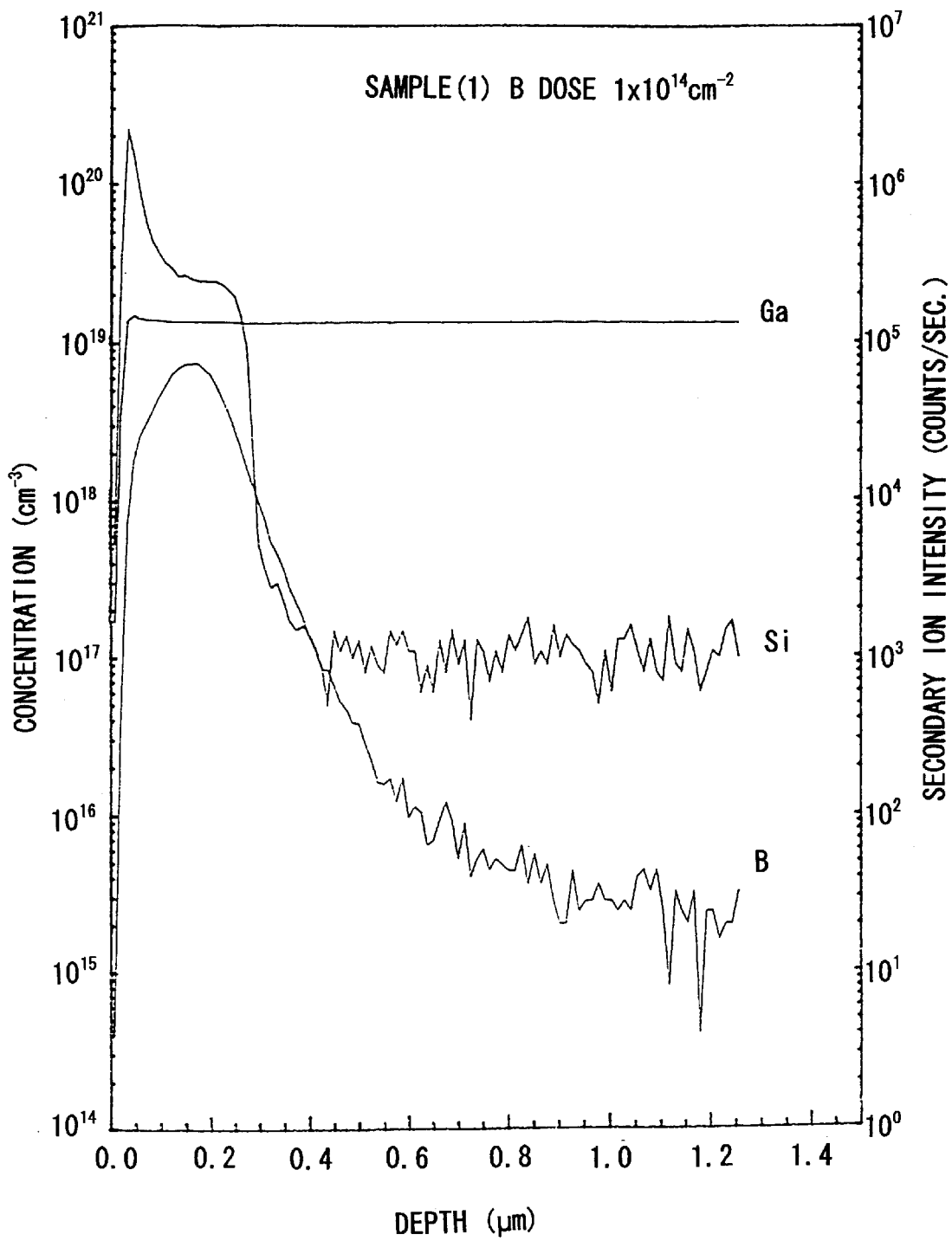
FIG. 1 is a schematic diagram for explaining results of SIMS measurement conducted in the course of leading to the present invention.
Figure 2:
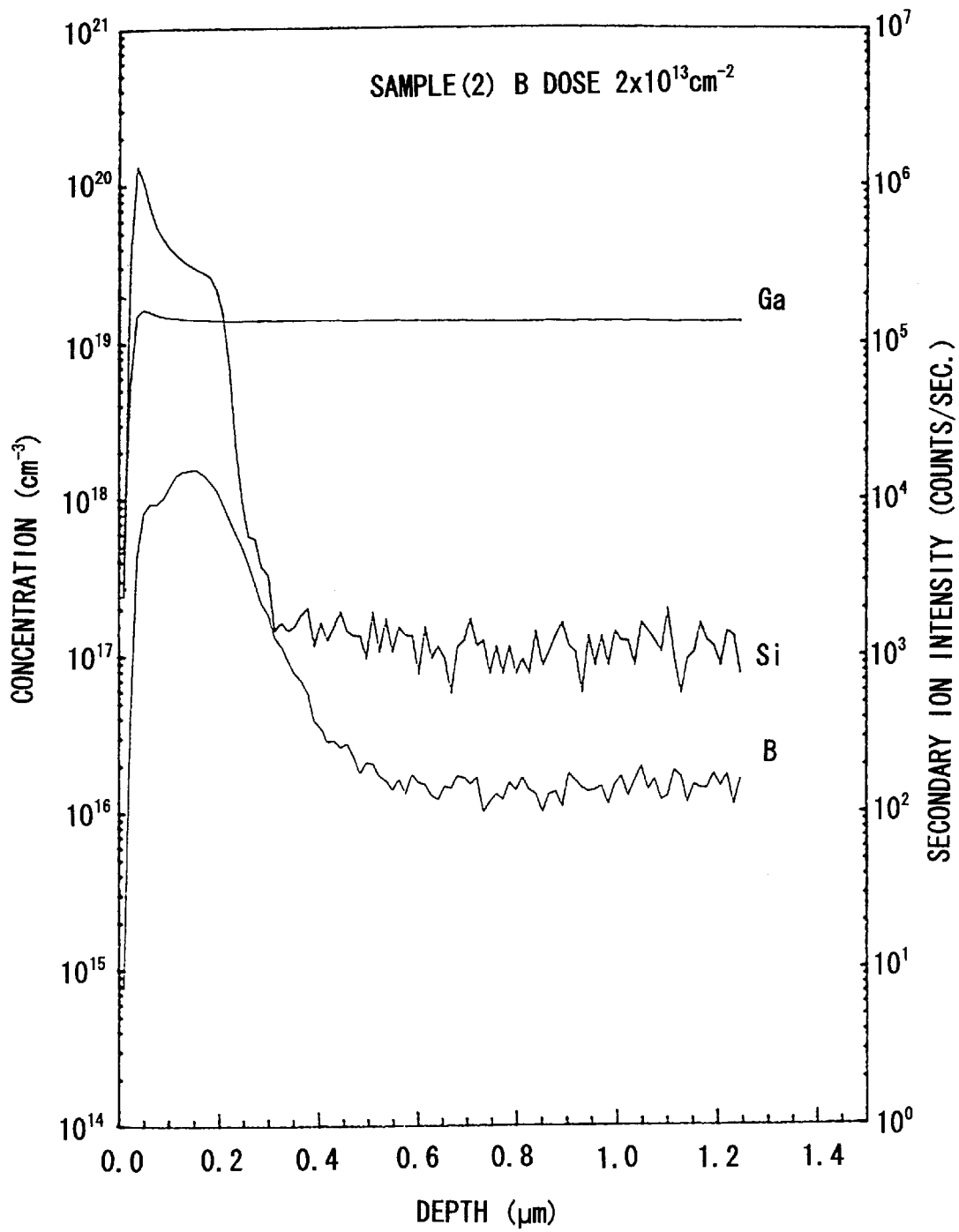
FIG. 2 is a schematic diagram for explaining results of SIMS measurement conducted in the course of leading to the present invention.
Figure 3:
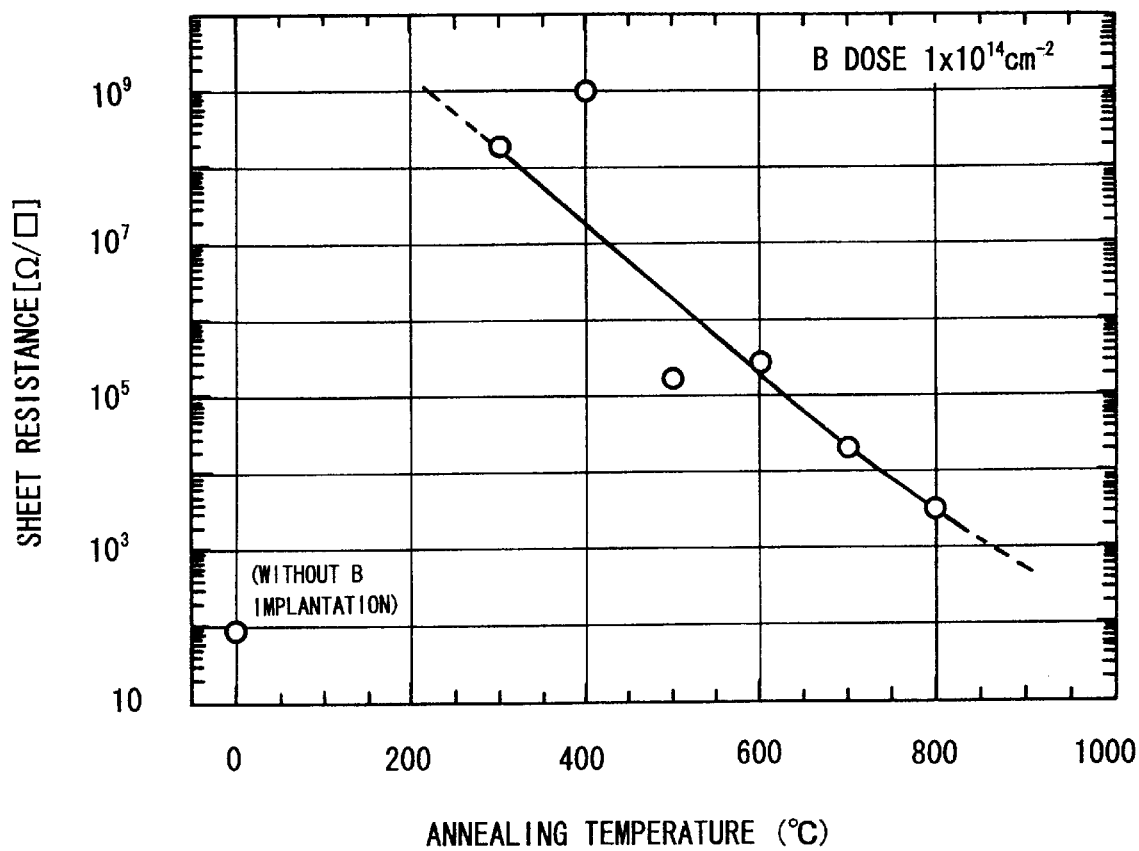
FIG. 3 is a schematic diagram for explaining results of measurement conducted in the course of leading to the present invention to know dependence of the sheet resistance value upon annealing temperatures.
Figure 4:
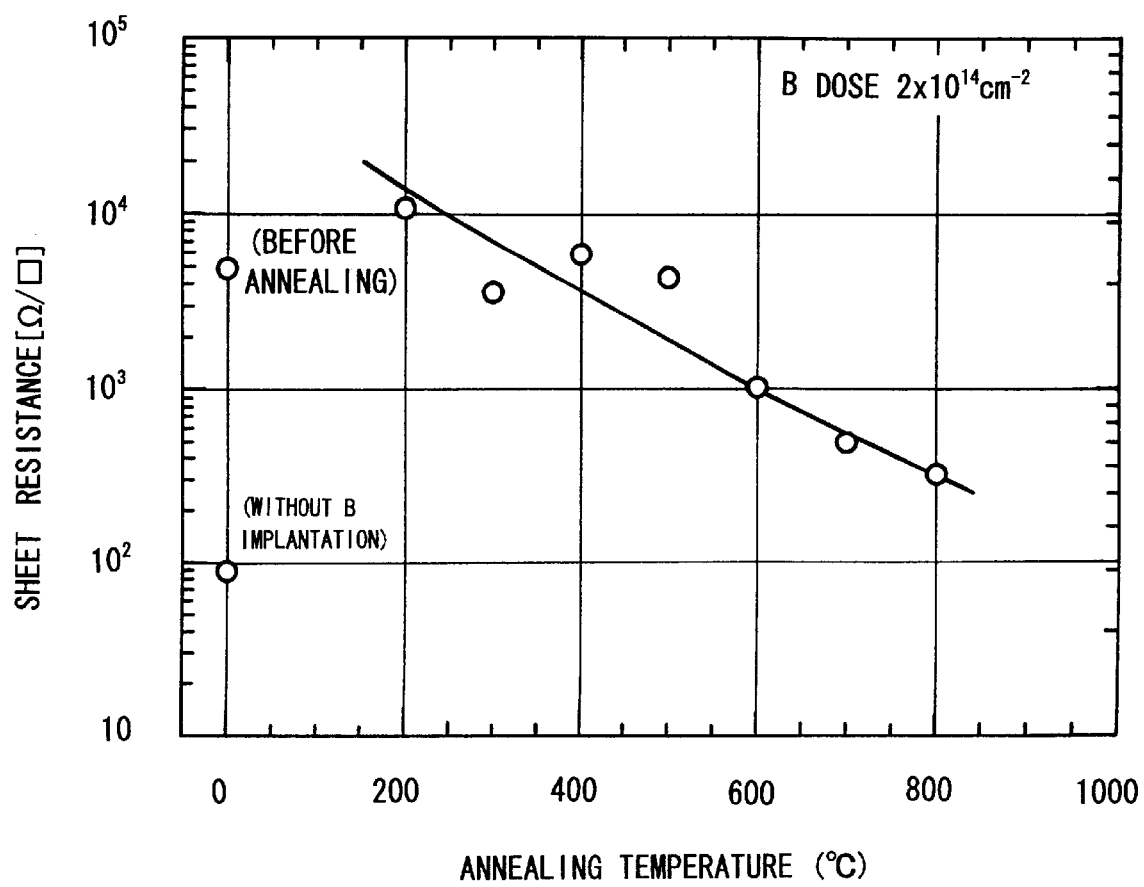
FIG. 4 is a schematic diagram for explaining results of measurement conducted in the course of leading to the present invention to know dependence of the sheet resistance value upon annealing temperatures;.
Figure 5A:
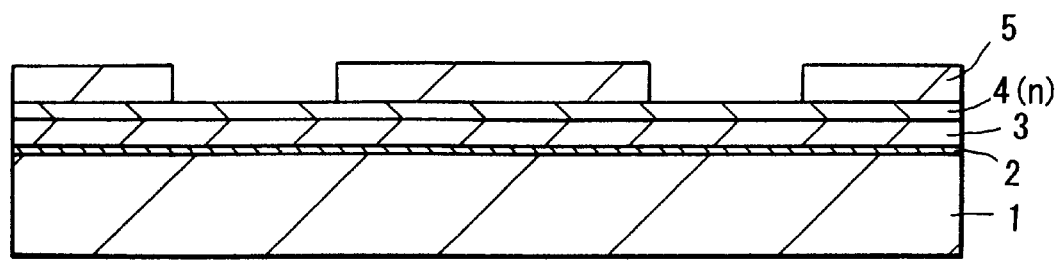
FIGS. 5A to 5D are cross-sectional views for explaining a method for manufacturing a GaN FET according to the first embodiment of the invention.

In the first embodiment, as shown in FIG. 5A, a GaN buffer layer 2 is first grown on a c-face sapphire substrate 1 by MOCVD at a low growth temperature about 560° C., for example. Subsequently, by MOCVD at a growth temperature about 1000° C., sequentially grown on the GaN buffer layer 2 are an undoped GaN layer 3 which may be 2 μm thick and an n-type GaN channel layer 4 which may be 0.2 μm thick and is doped with Si by the concentration of $3 \times 10^{18}$ cm$^{-3}$. Next grown on the n-type GaN channel layer 4 is an insulation film 5 such as $SiO_2$ film or $Si_3N_4$ film by CVD, for example. Thereafter, a resist pattern (not shown) having an opening in a location for the device isolating region is made on the insulation film 5 by lithography, and the insulation film 5 is selectively removed by etching by using the resist pattern as a mask. The resist pattern is removed thereafter.

Figure 5B:
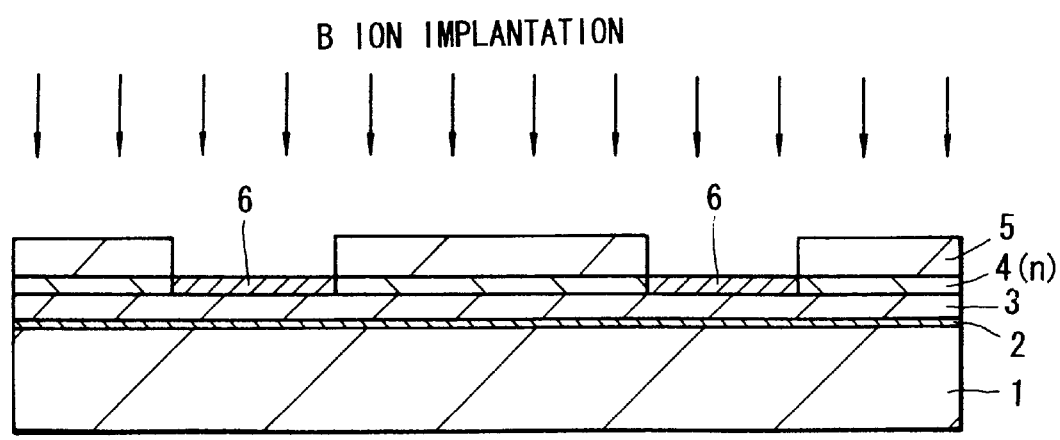

After that, as shown in FIG. 5B, using the insulation film 5 as a mask and implanting B ions at least to the full depth of the n-type GaN channel layer 4, a high resistance region 6 operating the device isolating region is made. The ion implantation of B is done under the conditions where the amount of implanted B to the n-type GaN channel layer 4 be not less than 1/30, or more preferably, not less than 1/15, of the carrier concentration of the n-type GaN channel layer 4. Specific conditions of ion implantation of B are, for example, the implantation energy of 60 keV, the dose amount of $1 \times 10^{13}$ cm$^{-3}$.

Figure 5C:
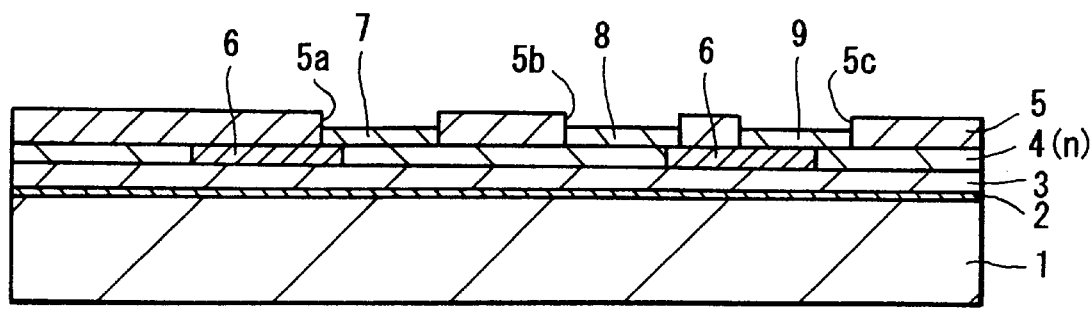

After that, as shown in FIG. 5C, a resist pattern (not shown) having openings in locations of the insulation film 5 for a source electrode and drain electrode of FET and for an ohmic electrode of a Schottky diode, explained later, is formed thereon by lithography, and the insulation film 5 is selectively removed by etching using the resist pattern as a mask to make openings 5a, 5b and 5c. Thereafter, still maintaining the resist pattern, an ohmic metal film, such as Ti/Al film or Ti/Al/Pt/Au film, is formed on the entire surface by vacuum evaporation, for example. Then. the resist pattern is removed together with the ohmic metal film thereon (lift-off). As a result, a source electrode 7, drain electrode 8 and electrode 9 are made respectively in the openings 5a, 5b and 5c. These source electrode 7, drain electrode 8 and electrode 9 are in ohmic contact with the n-type GaN channel layer 4.

Figure 5D:
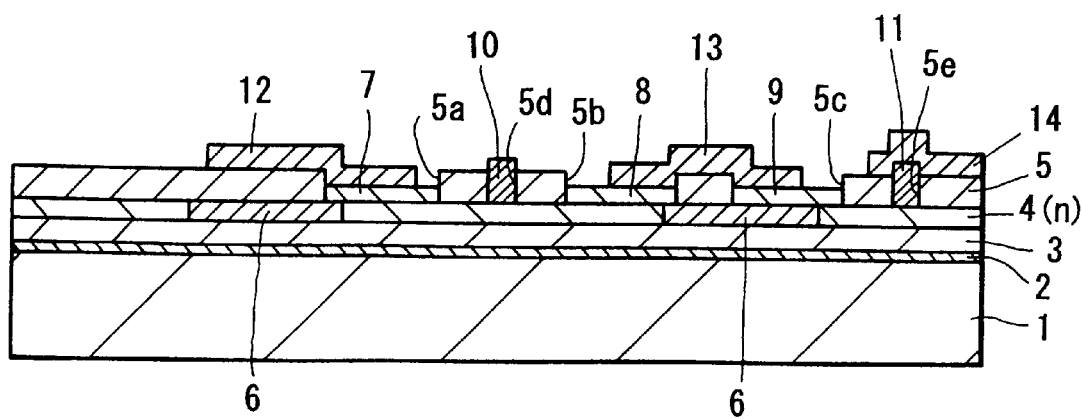

After that, as shown in FIG. 5D, a resist pattern (not shown) having openings in locations for a Schottky gate electrode of FET and for a Schottky electrode of a Schottky diode is formed. Using the resist pattern as a mask, the insulation film 5 is selectively removed by etching to make openings 5d and 5e. Thereafter, still maintaining the resist pattern, a Schottky metal film such as Ti/Au film or Ti/Pt/Au film is made on the entire surface by vacuum evaporation, for example. Later, the resist pattern is removed together with the Schottky metal film thereon. As a result, the Schottky gate electrode 10 and the Schottky electrode 11 are made respectively in openings 5d and 5e. The Schottky gate electrode 10, n-type GaN channel layer 4, source electrode 7 and drain electrode 8 form a GaN FET whereas the Schottky electrode 11, n-type GaN channel layer 4 and electrode 9 form a Schottky diode.

After that, a resist pattern (not shown) having openings in locations for wiring is formed by lithography, and a metal film such as Ti/Pt/Au film is next formed on the entire surface by vacuum evaporation, for example. Then, the resist pattern is removed together with the metal film thereon. As a result, a wiring 12 electrically connected to the source electrode 7, a wiring 13 electrically connected the drain electrode 8 and the electrode 9 of the Schottky diode, and a wiring 14 electrically connected to the Schottky electrode 11 of the Schottky diode are made.

As explained above, according to the first embodiment, since the high resistance region 6 behaving as the device isolating region is made by implanting B ions not less than 1/30, or more preferably not less than 1/15, of the carrier concentration of the n-type GaN channel layer 4 into the n-type GaN channel layer 4 in location for the device isolating region, the high resistance region 6 exhibiting a practically acceptable high sheet resistance value not lower than 1 MΩ/□ required for the device isolating region can be obtained even when the working temperature is 500° C. Therefore, the device can fully achieve the high performance peculiar to the GaN FET, and a high-performance GaN FET operative with high frequencies, high temperatures and high powers can be realized.

Figure 6:
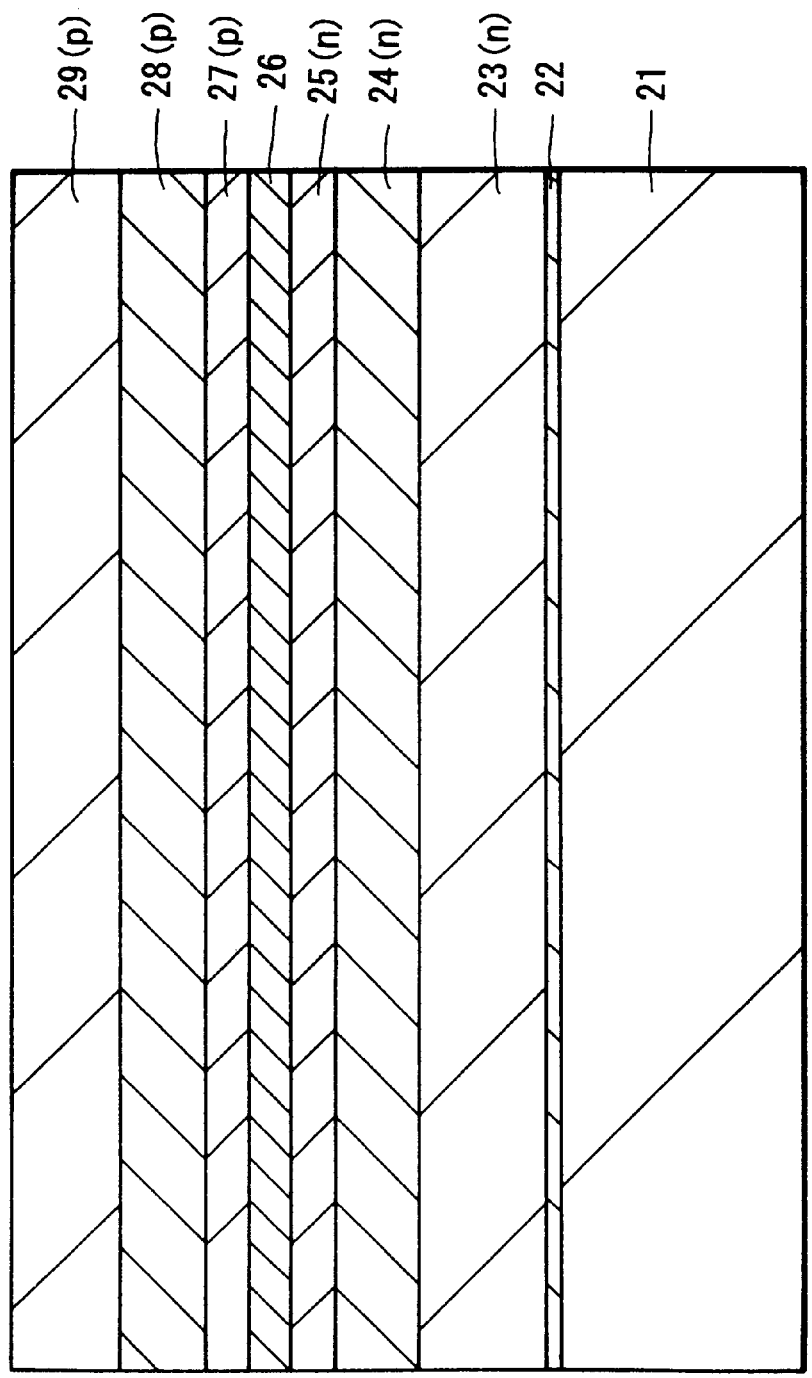
FIG. 6 is a cross-sectional view for explaining a method for manufacturing a GaN semiconductor laser according to the second embodiment of the invention.
Figure 7:
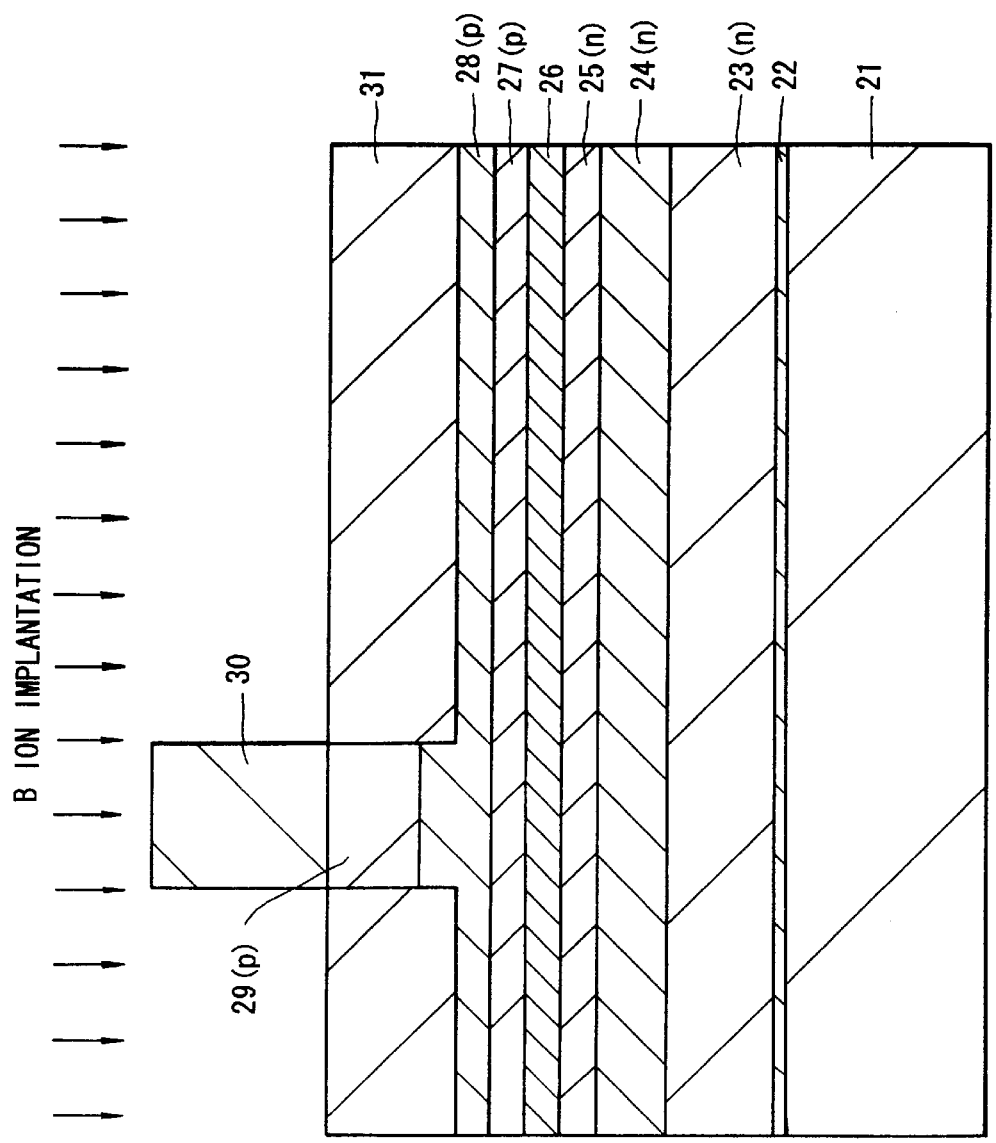
FIG. 7 is a cross-sectional view for explaining a method for manufacturing a GaN semiconductor laser according to the second embodiment of the invention.
Figure 8:
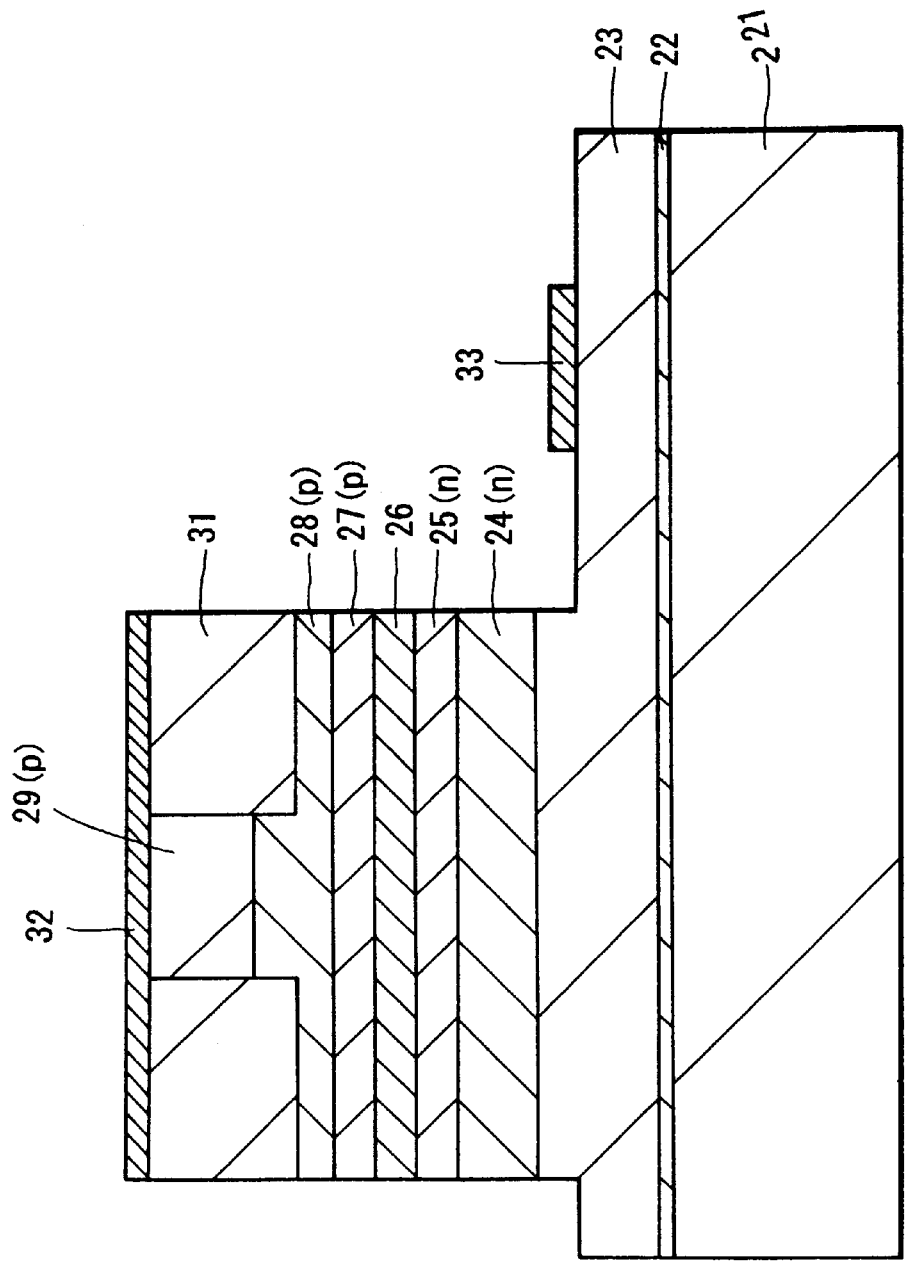
FIG. 8 is a cross-sectional view for explaining a method for manufacturing a GaN semiconductor laser according to the second embodiment of the invention.

Next explained is a method for manufacturing a GaN semiconductor laser according to the second embodiment of the invention. FIGS. 6 through 8 illustrate the manufacturing method. The GaN semiconductor laser has a SCH (separate confinement heterostructure) structure.

In the second embodiment, as shown in FIG. 6, a GaN buffer layer 22 is first grown on a c-face sapphire substrate 21 by MOCVD under a low growth temperature around 560° C., for example. Subsequently, sequentially grown on the GaN buffer layer 22 by MOCVD are an n-type GaN contact layer 23, n-type AlGaN cladding layer 24, n-type GaN optical guide layer 25, active layer 26 of a $Ga_{1-x}In_xN/Ga_{1-y}In_yN$ multiquantum well structure, for example, p-type GaN optical guide layer 27, p-type AlGaN cladding layer 28 and p-type GaN contact layer 29. The growth temperature is set to 1000° C., for example, for growth of the layers not containing In, namely, n-type GaN contact layer 23, n-type AlGaN cladding layer 24, n-type GaN optical guide layer 25, p-type GaN optical guide layer 27, p-type AlGaN cladding layer 28 and p-type GaN contact layer 29 whereas the growth temperature is set to 700 through 800° C., for example, for growth of the active layer 26 of the $Ga_{1-x}In_xN/Ga_{1-y}In_yN$ multiquantum well structure, which contains In. In an example of thicknesses of these layers, the GaN buffer layer 22 is 50 nm, the n-type GaN contact layer 23 is 3 µm, the n-type AlGaN cladding layer 24 is 0.5 µm, the n-type GaN optical guide layer 25 is 0.1 µm, the p-type GaN optical guide layer 27 is 0.1 µm, the p-type AlGaN cladding layer 28 is 0.5 µm, and the p-type GaN contact layer 29 is 0.5 µm. The n-type GaN contact layer 23, n-type AlGaN cladding layer 24 and n-type GaN optical guide layer 25 are doped with silicon (Si), for example, as the donor, whereas the p-type GaN optical guide layer 27, p-type AlGaN cladding layer 28 and p-type GaN contact layer 29 are doped with magnesium (Mg), for example, as the acceptor. After that, annealing is done for electrically activating the donor and the acceptor doped into these layer, especially for electrically activating the acceptor doped into the p-type GaN optical guide layer 27, p-type AlGaN cladding layer 28 and p-type GaN contact layer 29. The annealing temperature is set to 700° C., for example.

After that, as shown in FIG. 7, a resist pattern 30 having an opening in a location for a current blocking layer is made on the p-type GaN contact layer 29 by lithography. Using the resist pattern 30 as a mask, B ions are implanted by an energy to reach the half depth of the p-type AlGaN cladding layer 28 to make a high-resistance region 31 behaving as the current blocking layer. The ion implantation of B is done under the conditions where the amount of implanted B to the p-type GaN contact layer 29 and the p-type AlGaN cladding layer 28 be not less than 1/30, more preferably not less than 1/15, of the carrier concentration of the p-type GaN contact layer 29 and the p-type AlGaN cladding layer 28. In an example of conditions of B ion implantation, when the carrier concentration of the p-type GaN contact layer 29 and the p-type AlGaN cladding layer 28 is $2\times10^{18}$ $cm^{-3}$, the implantation energy is 160 keV, and the dose amount is $2\times10^{13}$ $cm^{-2}$.

Next, after the resist pattern 30 is removed, a stripe-shaped resist pattern (not shown) is formed on the p-type GaN contact layer 29. Using the resist pattern as a mask, reactive ion etching (RIE), for example, is conducted to pattern the p-type GaN contact layer 29, p-type AlGaN cladding layer 28, p-type GaN optical guide layer 27, active layer 26, n-type GaN optical guide layer 25, n-type AlGaN cladding layer 24 and the upper-lying portion of the n-type GaN contact layer 23 into the form of stripe. The resist pattern used as the etching mask is removed thereafter. Then, a p-side electrode 32 in form of Ni/Au film or Ni/Pt/Au film, for example, is made on the p-type GaN contact layer 29 and the high-resistance region 31, and an n-side electrode 33, which may be a Ti/Al film, is made on the n-type GaN contact layer 23 in the etched portion.

After that, the c-face sapphire substrate 21 having formed the laser structure is processed into bars by cleavage, for example, to make cavity edges, and after applying an edge coating onto the cavity edges, the bars are divided into chips by cleavage, for example. As a result, the intended GaN semiconductor laser having a SCH structure is completed.

According to the second embodiment, since the high-resistance region 31 behaving as the current blocking layer is made by implanting B ions not less than 1/30 or more preferably not less than 1/15, of the carrier concentration of the p-type GaN contact layer 29 and the p-type AlGaN cladding layer 28 into these p-type GaN contact layer 29 and the p-type AlGaN cladding layer 28 in the location for the current blocking layer, it is ensured that the high resistance region 31 exhibits a practically acceptable high sheet resistance not lower than 1 MΩ/□ required for the current blocking layer even when the working temperature is 500° C. Therefore, the laser fully achieves the high performance peculiar to a GaN semiconductor laser, and a high-performance GaN semiconductor laser can be realized.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, structures, substrates, source materials and processes indicated used in the first and second embodiments are only examples, and any other appropriate numerical values, structures, substrates, source materials and processes may be used.

Specifically, although the first and second embodiments use a c-face sapphire substrate, a silicon carbide (SiC) substrate, GaN substrate, or zinc oxide (ZnO) substrate may be used where appropriate.

As explained above, according to the invention, a high resistance region capable of maintaining a high resistance even under high temperatures can be obtained by making the high resistance region by local ion implantation of boron into a nitride III–V compound semiconductor layer having an electric conductivity.

What is claimed is:

1. A semiconductor device including a high-resistance region locally formed in an electrically conductive nitride III–V compound semiconductor layer, comprising:

said high-resistance region being made by ion implantation of boron.

2. The semiconductor device according to claim 1 wherein said high-resistance region has a sheet resistance value not lower than 1 M$\Omega$/□ in the range of working temperatures.

3. The semiconductor device according to claim 1 wherein the amount of boron by said ion implantation is not less than 1/30 of the carrier concentration of said nitride III–V compound semiconductor layer.

4. The semiconductor device according to claim 1 wherein the amount of boron by said ion implantation is not less than 1/15 of the carrier concentration of said nitride III–V compound semiconductor layer.

* * * * *